United States Patent [19]
Hayashi et al.

[11] Patent Number: 5,768,184
[45] Date of Patent: Jun. 16, 1998

[54] PERFORMANCE NON-VOLATILE SEMICONDUCTOR MEMORY DEVICE

[75] Inventors: Yutaka Hayashi; Machio Yamagishi, both of Kanagawa, Japan

[73] Assignee: Sony Corporation, Tokyo, Japan

[21] Appl. No.: 594,437

[22] Filed: Jan. 31, 1996

[30] Foreign Application Priority Data

Feb. 1, 1995 [JP] Japan ................................. 7-015424
Apr. 28, 1995 [JP] Japan ................................. 7-106679

[51] Int. Cl.$^6$ ................................................ G11C 11/34
[52] U.S. Cl. .............................. 365/185.03; 365/185.2
[58] Field of Search ........................ 365/185.03, 185.2, 365/185.21, 168, 210

[56] References Cited

U.S. PATENT DOCUMENTS 4,807,188  2/1989  Casagrande ................. 365/185.05
5,418,743  5/1995  Tomioka et al. ............. 365/168 X

FOREIGN PATENT DOCUMENTS 0 656 628 A2  11/1994  European Pat. Off. .
0 666 598 A3   2/1995  European Pat. Off. .
WO 90/12400  10/1990  WIPO .

OTHER PUBLICATIONS

IBM Technical Disclosure Bulletin, "Mid–Level Current Generator Circuit", vol. 33, No. 1B, Jun. 1990, pp. 386–388.

Primary Examiner—Joseph A. Popek
Attorney, Agent, or Firm—Hill, Steadman & Simpson

[57] ABSTRACT

A non-volatile semiconductor memory device including a plurality of non-volatile memory cells and a plurality of reference cells provided for corresponding to storage states in the non-volatile memory cell, generating a reference current which is a current between two output currents of at least two reference cells or a current proportional to the current when data reading from the non-volatile memory cell, and comparing the reference current and a current from the non-volatile memory cell to read out a data stored in the non-volatile memory cell.

12 Claims, 14 Drawing Sheets

PERFORMANCE NON-VOLATILE SEMICONDUCTOR MEMORY DEVICE

BACKGROUND INVENTION

1. Field of the Invention

The present invention relates to a rewritable non-volatile semiconductor memory device, and more particularly, relates to a non-volatile semiconductor memory device which can substantially improve the data retention characteristic, number of rewrites, and manufacturing yield of particularly a non-volatile multi-level memory having a small window.

2. Description of the Related Art

In a non-volatile semiconductor memory device, use has been made of a differential amplifier to read the data of a transistor constituting a selected memory cell. In the differential amplifier, a voltage signal data or current signal data (hereinafter also referred to overall as "reading signal") from the selected memory cell is compared with a reference voltage or reference current (hereinafter also referred to overall as "reference signal") and data reading is carried out. The reference signal, in general, can be generated by a reference memory cell which is identical to a memory cell.

The threshold values of memory cells forming a storage array are varied along with the lapse of time, due to the characteristic deterioration by rewrite operation, the change of a storage retention characteristic with the lapse of time, the manufacturing variation, etc., and thus, when data reading from the storage array is carried out, malfunction of the data read may occur.

In particular, in the multi-level storage, for example, when two data are stored in one memory cell, a threshold value control process is very difficult because there are four different threshold values, and the four different threshold values must correspond to four data stored in the memory cell indicating four different states.

The above mentioned difficulty of the threshold value control in the multi-level storage will be described with reference to specific examples.

In a non-volatile semiconductor memory device, as shown in FIG. 1A, a threshold voltage $V_{th0}$ of a memory cell in which the "0" data (off at the time of reading) is stored may fall along with the elapse of time (abscissa of graph, logarithm scale of time: log t) due to the deterioration of the rewriting characteristic of the transistor, deterioration of the data retention characteristic, manufacturing variations, etc. In this case, there is a concern that the voltage will fall to a level less than the gate voltage Vr at the time of reading data and that a malfunction will accordingly occur. Note that, in FIG. 11(A), $V_{th1}$ indicates a change of the threshold voltage of the memory cell in which the "1" data (on at the time of reading) is stored.

When observing this state for the current from the memory cell, the state becomes as shown in FIG. 1B. A current $i_{r0}$ which is read out from the memory cell in which the "0" data is stored is increased along with the elapse of time. Note that, a current $i_{r1}$ which is read out from the memory cell in which the "1" data is stored remains substantially constant without regard as to the elapse of time. This is because there is where a transistor constituting a memory cell is a transistor having a floating gate, electrons are not injected into the floating gate of the memory cell in which the "1" data is stored.

On the other hand, as the reference cell for preparing the reference data, conventionally a transistor which becomes ON at the time of reading ("1" data is stored) is used and set up so that the reference current $i_{rr}$ at the time of the reading is in a constant proportion relative to $i_{r1}$, for example, about ¼, and therefore even if $i_{r1}$ varies along with then elapse of time, the reference current $i_{rr}$ varies in constant proportion with $i_{r1}$, and therefore, at the time of detection of the "1" data, a malfunction is avoided. On the other hand, when the current $i_{r0}$ read out from a memory cell in which the "0" data is stored starts to vary and exceeds the reference current $i_{rr}$ at a certain point of time, there is a concern over a malfunction.

In recent years in particular, there has been an active trend toward use of multiple values in non-volatile semiconductor memory devices. The above-mentioned problem is further serious in such a multi-level memory.

As a multi-level memory cell, in the same way as the binary case, for example a transistor having a floating gate is used. This is because, in this case, the threshold voltage must be controlled at a further finer level.

Here, when consideration is made using one example of a memory cell which can store the four levels of V (0, 0), V (0, 1), V (1, 0), and V (1, 1) as an example, the distribution of the threshold voltages of the level 0 to level 3 is, as shown in FIG. 2, a level 3 (1, 1) of 1.5 V to 3 V, a level 2 (1, 0) of 3.7 V to 4 V, a level 1 (0, 1) of 4.6 V to 4.9 V, and a level 0 (0, 0) of 5.6 V to 5.9 V.

The distribution of the threshold voltages immediately after writing in the multi-level memory cell is sharp as shown in FIG. 2.

In reading data from this multi-level memory cell in which data is stored over four levels, conventionally, the threshold voltage of the cell to be read out and the level 1 to level 3 are compared to determine the value of the data. Namely, the decision of the data is carried out by a comparison at the voltage levels.

Note, even with a distribution of voltages which was sharp immediately after manufacturing, as the writing is repeated, the variation of the voltages becomes larger and in addition the holding characteristic is deteriorated and deviation is caused in the threshold voltages. Therefore, as shown in, for example, FIG. 3, where it is sensed by constant read voltages $V_{r11}$, $V_{r10}$, and $V_{r00}$, a malfunction results after a lapse time longer than the time indicated by the arrows in the figure.

SUMMARY OF THE INVENTION

An object of the present invention is to provide a non-volatile semiconductor memory device, specifically a multi-level memory device needed a precise control of threshold values, which can substantially improve the data retention characteristic, number of rewrites and manufacturing yield.

According to the present invention, there is provided a non-volatile semiconductor memory device comprising: a plurality of non-volatile memory cells; a plurality of reference cells provided for corresponding to the number of states of each of the non-volatile memory cells; a reference current generation circuit which generates a current, or k-multiple current of the same, of current outputs from at least two cells among the plurality of the reference cells at the time of reading the data from the non-volatile memory cell; and a decision circuit which decides the value stored in the non-volatile memory cell by comparing a current, or k-multiple current of the same, of the non-volatile memory cell and the output current of the reference current generation circuit.

The plurality of reference cells may be provided for every predetermined number of multi-level memory cells. Also, the predetermined number of memory cells and predetermined number of reference cells may be connected by the same word line, whereby they can be simultaneously driven (writing or reading). Note, if they can be driven at almost the same time, it is not always necessary to connect them by the same word line.

The memory cell and reference cell are not particularly limited so far as they are transistors having a function of holding data by an increase/decrease of the amount of storage of charges, inversion of the polarity, etc. They can be constituted by for example a transistor having a floating gate which can store a charge, a transistor having an insulation film which has a charge trapping function, a transistor having a ferro-electric film, etc.

In the present invention, the intermediate value generation circuit is constituted by an adder circuit which selects at least two among the output lines of the plurality of reference cells and performs simple addition or weighted addition on the values of the currents flowing through the output lines; and a transistor which receives a current of the added value of the adder circuit and which has, as a predetermined ratio, a relationship of the values of the channel width divided by the channel length so as to generate a current of an intermediate value, or k-multiple of the same, of a plurality of current values which are added.

Also, the present invention may be configured so that the intermediate value generation circuit and the comparison and decision circuit are integrally formed; and a transistor constituting a part of the intermediate value generation circuit acts also as the transistor of a part of the differential amplifier constituting the comparison and decision circuit. In this case, the present invention has at least a first current-to-voltage conversion transistor which converts an output current of the adder circuit to a voltage; a first transistor for a differential amplifier to which the output line of the first current-to-voltage conversion transistor is connected, which constitutes the transistor of a part of the differential amplifier; a second current-to-voltage conversion transistor which converts a signal current of the output line of the multi-level memory cell to a voltage; and a second transistor for a differential amplifier to which the output line of the second current-to-voltage conversion transistor is connected, which constitutes the transistor of a part of the differential amplifier, and these first current-to-voltage conversion transistor, second current-to-voltage conversion transistor, first transistor for differential amplifier, and second transistor for differential amplifier, have as predetermined ratios, relationships of values of the channel widths divided by the channel lengths, thereby to enable comparison and decision between the reference current, or k-multiple of the same, and the signal current, or k-multiple of the same, of the non-volatile memory cell.

Also, in the present invention, preferably a transistor for stabilizing a voltage conversion operation of the first current-to-voltage conversion transistor and second current-to-voltage conversion transistor and, at the same time, for setting an initial state of the differential amplifier is added.

In the multi-level non-volatile semiconductor memory device according to the present invention, a plurality of cells are arranged as the reference cells. The value of the data is stored in the cell among them which corresponds to the value of the data of the multi-level memory cell. At the time of reading of a selected multi-level memory cell, an intermediate value, or k-multiple of the same, of the current outputs from at least two cells among a plurality of reference cells is generated and used as the reference data. For this reason, this intermediate value, or k-multiple, current varies along with the elapse of time so as to pass between two data, or k-multiple of the same, (windows) at the time of the reading of the multi-level memory cell. Accordingly, the decision of the data stored in the multi-level memory cell can be accurately carried out without concern as to deterioration of the rewriting characteristic, deterioration of the data retention characteristic, etc.

Also, even if there are manufacturing variations in the transistors constituting the multi-level memory cell, it can be considered that similar manufacturing variations exist also in the transistors constituting the reference cells. Further, the reference data acting as a reference for the comparison and decision circuit is positioned between windows for the above-mentioned reason. Therefore, as a result, the accuracy of the reading of data will not be degraded. Accordingly, also the manufacturing yield of the non-volatile semiconductor memory device will be improved.

BRIEF DESCRIPTION OF THE DRAWINGS

The above and other objects and features of the present invention will be described more in detail with reference to the accompanying drawings, in which.

DESCRIPTION OF THE PREFERRED EMBODIMENTS

A non-volatile semiconductor memory device according to the present invention will be explained in further detail with reference to the accompanying drawings.

Figure 4:
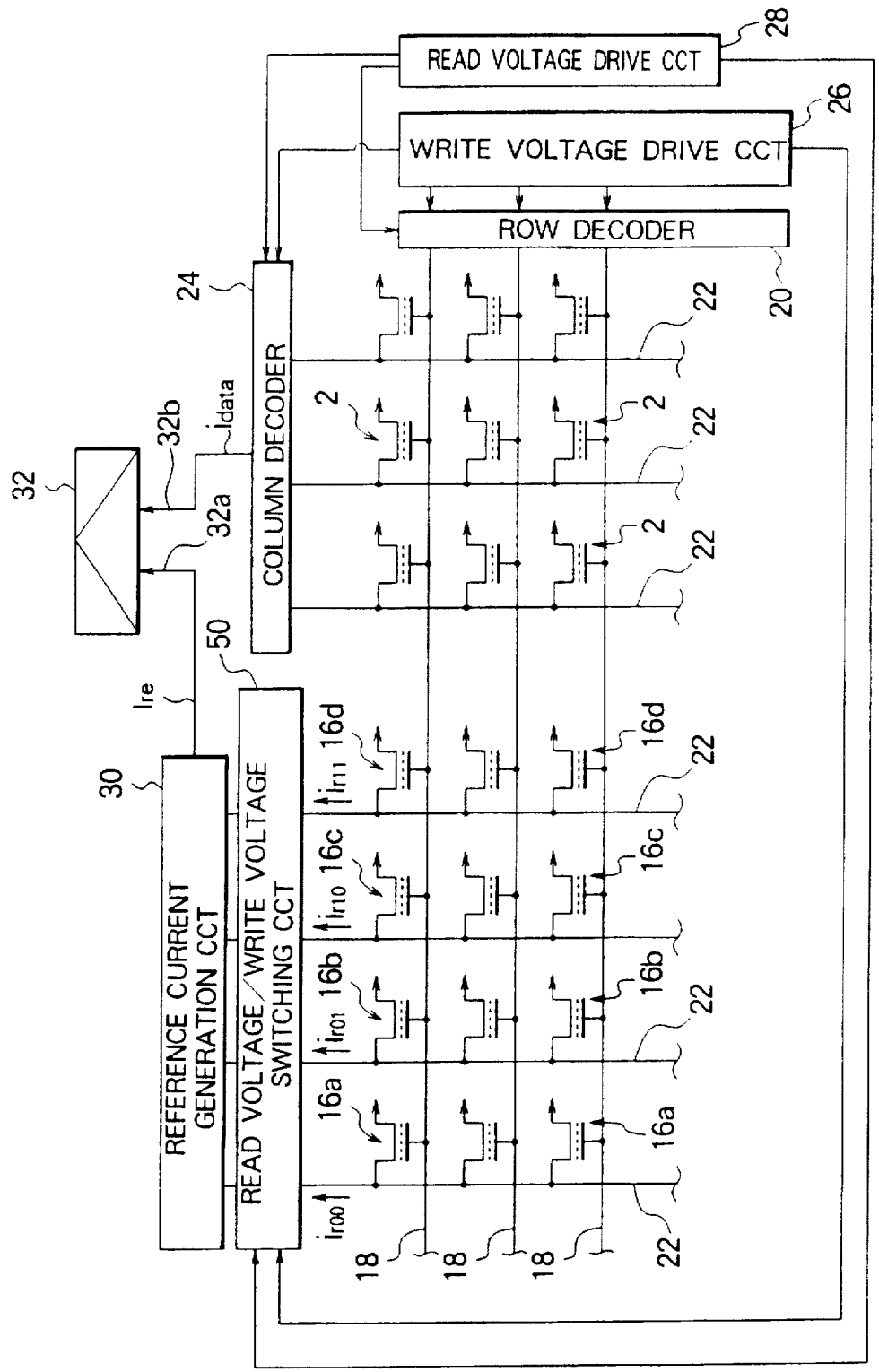
FIG. 4 is a schematic view of the configuration of a non-volatile semiconductor memory device according to an embodiment of the present invention.

FIG. 4 is a schematic view of the configuration of a non-volatile semiconductor memory device according to one embodiment of the present invention.

As shown in FIG. 4, the non-volatile semiconductor memory device of the present embodiment is a NOR-type memory and the multi-level memory cells 2 are arranged in the form of a matrix. Each multi-level memory cell 2 is constituted by a transistor having a floating gate in the present embodiment.

Figure 5:
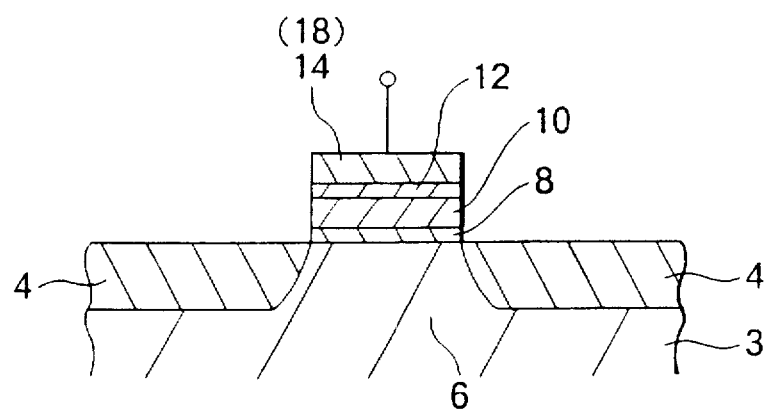
FIG. 5 is a cross-sectional view of an elementary part of a memory cell according to the embodiment of the present invention.

With a transistor having a floating gate, as shown in FIG. 5, a channel-forming region 6 between the source and drain regions 4, 4 formed in a surface region or well of a semiconductor substrate 3 has laid on it, via a gate insulating input 8, a floating gate 10, an intermediate insulating film 12, and a control gate 14. In this transistor, by controlling the voltage to be applied to the control gate 14 (word line) and the source and drain regions 4, 4 (bit line and source), electrons are injected into or removed from the floating gate 10 by utilizing the FN (Fowler Nordheim) effect or the like, whereby the threshold voltage of the transistor is changed, and the writing and erasing of at least three-level data, for example, four-level data of V (0,0), V (0,1), V (1,0), and V (1,1) can be carried out.

Figure 1A:
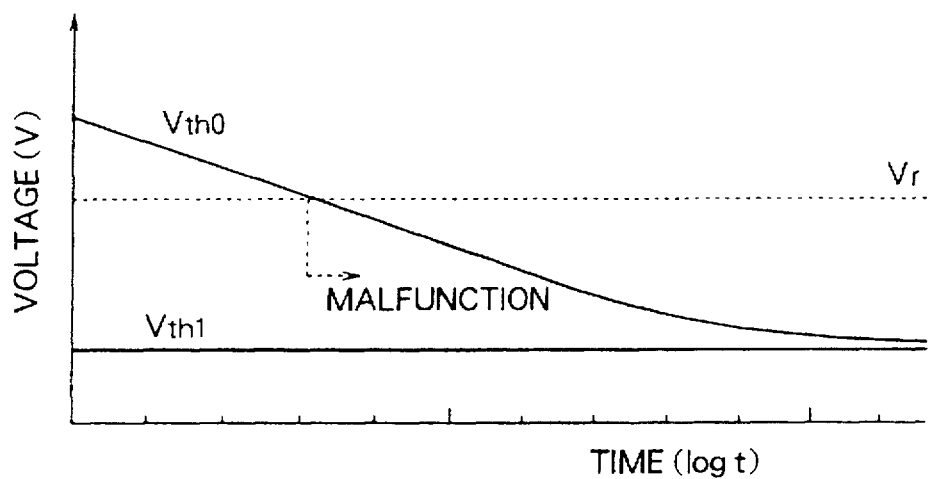
FIGS. 1A and 1B are graphs showing the change of the characteristics along with the elapse of time of the memory cell.
Figure 1B:
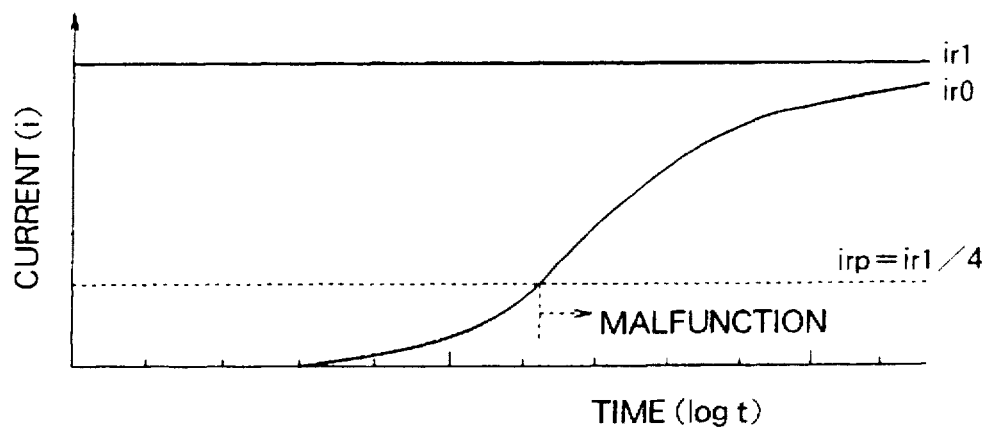
Figure 2:
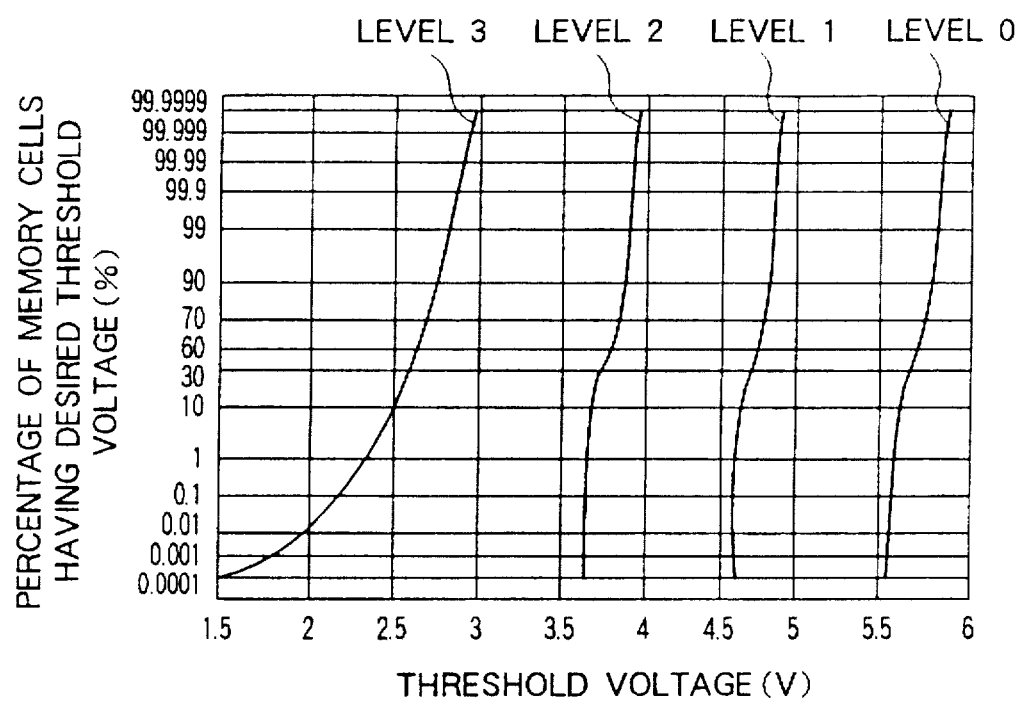
FIG. 2 is a graph showing the distribution of the threshold voltage of a 4-level memory cell.
Figure 3:
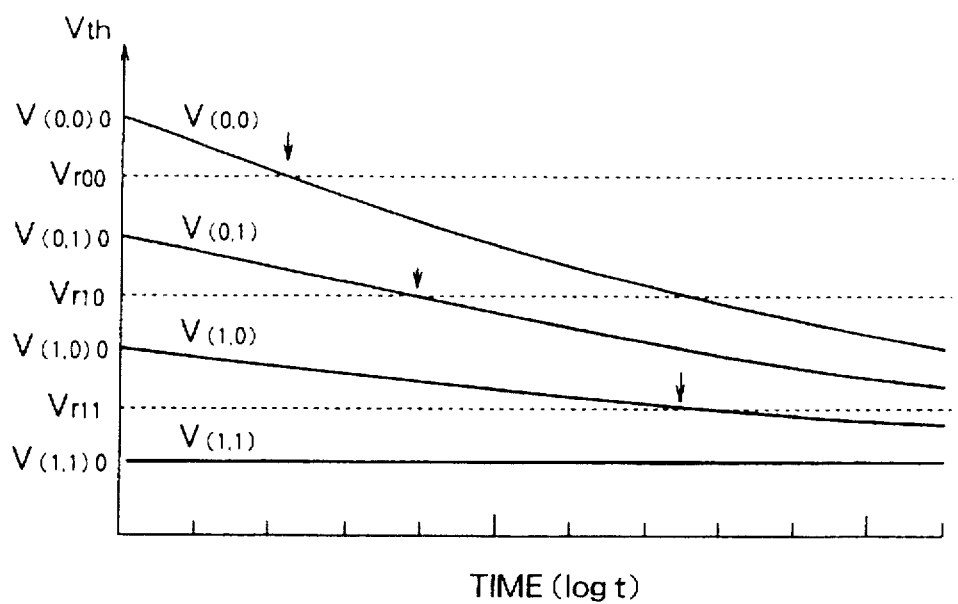
FIG. 3 is a graph showing the change along with the elapse of time of the 4-level memory cell.

In the case of a memory cell which can store four levels of V (0,0), V (0,1), V (1,0), and V (1,1), the distribution of the threshold voltages of the level 0 to level 3 is, as shown in FIG. 2, a level 3 (1, 1) of 1.5 V to 3 V, a level 2 (1, 0) of 3.7 V to 4 V, a level 1 (0, 1) of 4.6 V to 4.9 V, and a level 0 (0, 0) of 5.6 V to 5.9 V.

The distribution of the threshold voltages immediately after writing into the multi-level memory cell is sharp as shown in FIG. 2.

To write the four levels, for example, first erasure is performed to shift the threshold voltage to the level "0" or more, then electrons are injected into the floating gate while applying a write bias voltage, and a verification operation comprised of repeatedly suspending the write operation and reading the written state is performed. This ends at the point when the above-mentioned desired threshold voltage is obtained.

When for example a P-type monocrystalline silicon wafer is used as the semiconductor substrate 3, if an N-type monocrystalline silicon wafer is used in the surface region thereof, the transistor 2 for the multi-level memory cell is formed in a P-type well formed on the surface thereof. The source and drain regions 4, 4 are for example N-type impurity regions and are formed by performing ion implantation after the preparation of the floating gate 10 and the control gate 14. It is also possible if the source and drain regions 4, 4 have an LDD construction. The gate insulating film 8 is constituted by a silicon oxide film having a thickness of for example about 8 nm. The floating gate 10 is constituted by for example a polycrystalline silicon layer. Note that, although the illustration is omitted, the side surface of the floating gate 10 is covered by an insulating side wall. The intermediate insulating film 12 is constituted by for example a silicon oxide film or an ONO film (laminated film of a silicon oxide film, a silicon nitride film, and a silicon oxide film), etc., and the thickness thereof is for example 14 nm converted to a silicon oxide film. The control gate 14 is constituted by for example a polycrystalline silicon film or "polycide" film (laminated film of the polycrystalline silicon film and silicide film).

As shown in FIG. 4, in the present embodiment, four reference cells 16a, 16b, 16c, and 16d are arranged for every multi-level memory cell 2 of each row and can be driven simultaneously by the same word line 18. The multi-level memory cell 2 and the reference cells 16a, 16b, 16c, and 16d are constituted by transistors having roughly the same construction in the thickness direction. Having the same construction in the thickness direction means that, where the transistor constituting the multi-level memory cell 2 is a transistor of a type having a floating gate 10 with a construction shown in FIG. 5, the transistors constituting the reference cells 16a, 16b, 16c, and 16d also have a similar construction and film thickness. The channel length or channel width etc. of the transistors may differ.

The reference cells 16a, 16b, 16c, and 16d of each row are preliminarily determined in value of the data. For example, whenever any of the data V (0, 0) to V (1, 0) is written in the multi-level memory cell 2, V (0, 0) is written in the reference cell 16a; V (0, 1) is written in the reference cell 16b, V (1, 0) is written in the reference cell 16c, and V (1, 1) is written in the reference cell 16d, respectively.

Where the same data is written many times in a specific memory cell, sometimes a storage effect occurs. So as to avoid this, it is also possible to alternately write other data without repeatedly writing the specific data in one reference cell. In this case, for example a counter is connected to the word line 18 so as to enable determination of which data the reference cells 16a to 16d hold at present.

The word line 18 is connected to a row decoder 20. The drain region of the transistor of the multi-level memory cell 2 is connected to a column decoder 24 through the bit line 22. The drain regions of the transistors of the reference cells 16a, 16b, 16c, and 16d are connected to a read voltage/write voltage switching circuit 50 through the bit line 22.

The row decoder 20, column decoder 24, and read voltage/write voltage switching circuit 50 have connected to them a write voltage drive circuit 26 and a read voltage drive circuit 28. The voltage set by these drive circuits 26 and 28 is applied to a specified memory cell 2 and the reference cells 16a, 16b, 16c, and 16d through the word line 18 selected by the row decoder 20 and the bit line 22 selected by the column decoder 24 and the read voltage/write voltage switching circuit 50 for the erasing and writing of data.

The bit line 22 to which the reference cells 16a, 16b, 16c, and 16d are connected has connected to it, via the read voltage/write voltage switching circuit 50 (or directly), a reference current generation circuit 30 which performs simple addition or weighted addition (summation) by selecting two current values detected from the bit line 22 and generates an intermediate value, or k-multiple of the same, thereof.

7

Figure 6:
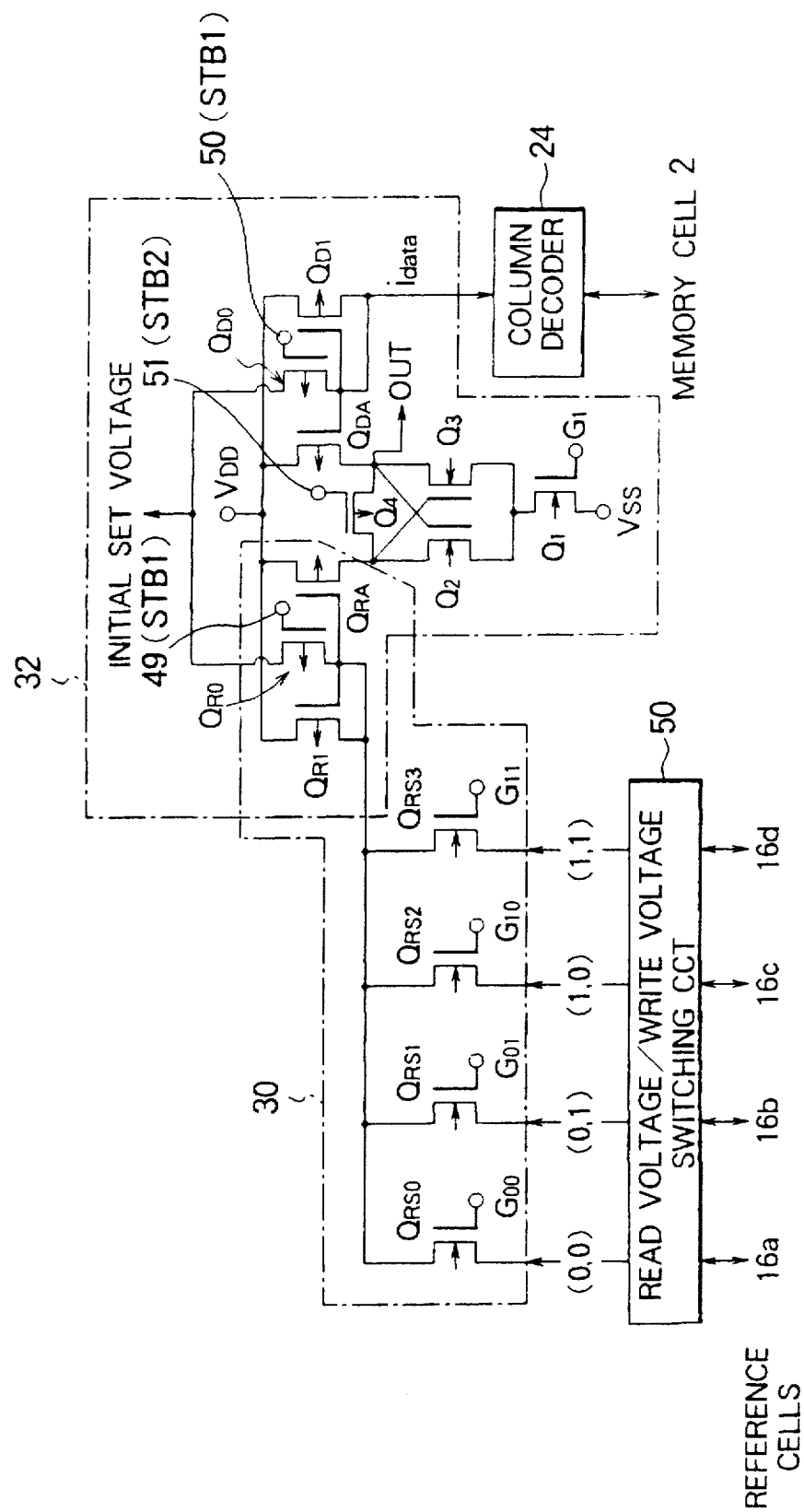
FIG. 6 is a circuit diagram of the configuration around a sense amplifier of the non-volatile semiconductor memory device according to a concrete embodiment of the present invention.

The reference current generation circuit 30 is provided for each of the bit lines 22 to which reference cells 16a, 16b, 16c, and 16d are connected as shown in FIG. 6 mentioned later and is constituted by a MOS transistor which is turned on or off by the control of the gate voltage, a so-called wired-OR interconnection connecting the output interconnections of these MOS transistors, and a plurality of MOS transistors adjusted in size (W/L) so as to halve the current output of the wired-OR interconnection. At this time, simple addition is carried out by the wired-OR interconnection.

The output of the reference current generation circuit 30 is connected to the first input terminal 32a of the decision circuit 32. To the other second input terminal 32b of the decision circuit 32, the data (current in the present embodiment) stored in the multi-level memory cell 2 selected at the time of the reading is input through the bit line 22 selected by the column decoder 24. Note that part of the reference current generation circuit 30 and the decision circuit 32 can be integrally formed as will be mentioned later.

To erase the data stored in the multi-level memory cell 2 and the reference cells 16a, 16b, 16c, and 16d, it is sufficient to apply predetermined voltages to the word line 18, bit line 22, source, and substrate, for example, 18 to 20 V to the word line 18, 0 V to the bit line 22, and 0 V to the source and substrate, so as to inject electrons into the floating gate.

To write the data V (0, 0), V (0, 1), V (1, 0), and V (1, 1) into a specified multi-level memory cell 2 selected by the row decoder 20 and column decoder 24 shown in FIG. 4, erasure is performed to align the threshold voltages, then the electrons are drawn from the floating gate while applying a writing bias voltage of for example −10 V to the word line 18 of the specific multi-level memory cell 2 from the write voltage drive circuit 26 and for example +5 V to the bit line 22. The operation is ended at a point of time when the above-mentioned desired threshold voltages $V_{(0,0)0}$, $V_{(0,1)0}$, $V_{(1,0)0}$, and $V_{(1,1)0}$ are obtained by a verification operation.

At the time of reading data from a specified multi-level memory cell 2 which is selected by the row decoder 20 and column decoder 24 shown in FIG. 4, predetermined voltages are applied from the read voltage drive circuit 28 to the word line 18 and the bit line 22 of the specific multi-level memory cell 2, for example, voltages such as $V_{r00}$, $V_{r10}$, $V_{r11}$, or the like (3 V to 5.5 V) are applied to the word line 18 and 1 V is applied to the bit line.

In the present embodiment, simultaneously with the reading of data from a specified multi-level memory call 2, the data is read simultaneously also from the four reference cells 16a, 16b, 16c, and 16d connected by the same word line 18 as that for the specified multi-level memory cell 2. The data current read from the selected multi-level memory cell 2 is input to the second input terminal 32b of the decision circuit 32 through the bit line 22 and the column decoder 24.

The currents $i_{r00}$, $i_{r01}$, $i_{r10}$, and $i_{r11}$ read from the reference cells 16a, 16b, 16c, and 16d are input to the reference current generation circuit 30 through the read voltage/write voltage switching circuit 50. In the reference current generation circuit 30, two among the input four currents are selectively added, and further a reference current $I_{re}$ which has an intermediate value of two current or a value of k-times of the intermediate value is produced. This reference current $I_{re}$ is input to the first input terminal 32a of the decision circuit 32.

Figure 7:
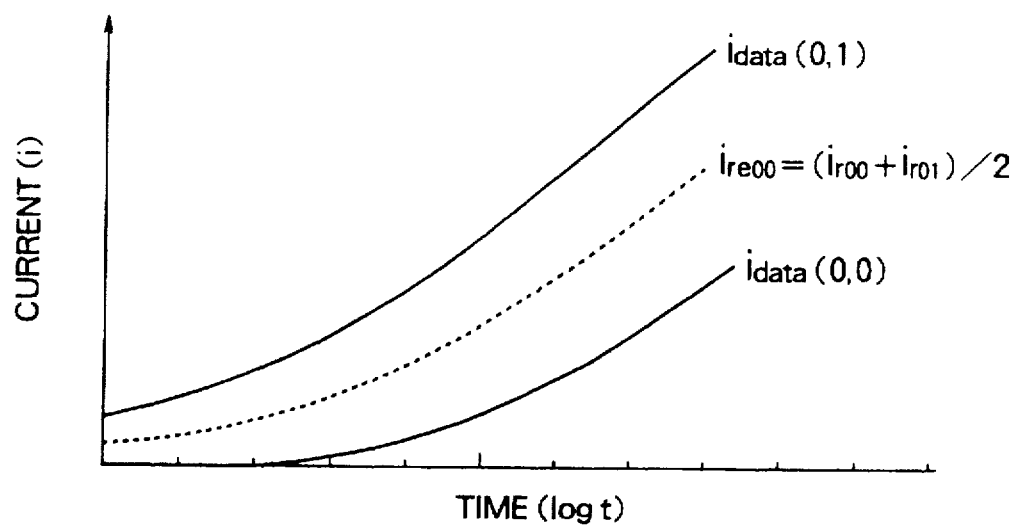
FIG. 7 is a graph showing the change along with the elapse of time of a reference current of the non-volatile semiconductor memory device according to the present invention.

The change of the reference current $i_{re}$ along with the elapse of a long period of time can be represented by a curve $i_{re00}$ of FIG. 7. Namely, the reference current $i_{re00}$ changes along with the change of the data current $i_{data(0,0)}$ read from

8 the multi-level memory cell 2 in which the data V (0, 0) is stored so as to be positioned at the middle of the windows. As a result, in the decision circuit 32 shown in FIG. 4, the decision of the V (0, 0) and V (0, 1) of the read currents $i_{data(0,0)}$ and $i_{data(0,1)}$ of the selected multi-level memory cell to be input to the second input terminal 32b can be accurately carried out based on the reference current $i_{re00}$ which is input to the first input terminal 32a.

By comparing the magnitudes of the read currents $i_{data(0,0)}$, $i_{data(0,1)}$, $i_{data(1,0)}$, and $i_{data(1,1)}$, or k-multiples of the same, of the selected multi-level memory cell to be input to the second input terminal 32b and the reference currents $i_{re}$ ($i_{re(0,0)}$, $i_{re(1,0)}$, and $i_{re(1,1)}$) or k-multiples of the same, it can be decided that which among the data V (0, 0), V (0, 1), V (1, 0), and V (1, 1) is stored in the multi-level memory cell 2.

The decision by the decision circuit 32 can retain its accuracy for a much longer period than in the past even if the memory characteristic or rewriting characteristic of the memory cell deteriorates along with the elapse of time as shown in FIG. 7.

Also, even if there are manufacturing variations in the multi-level memory cells 2, it can be considered that similar manufacturing variations exist in the reference cells 16a, 16b, 16c, and 16d. The reference current acting as the reference for the decision circuit 32 is positioned between the windows for the above-mentioned reason. Therefore, as a result, the accuracy of reading of data will not be degraded.

Note that, the present invention is not restricted to the above-mentioned embodiments and may be modified in various ways within the scope of the present invention.

For example, in the embodiments, the explanation was made of a case where the electrons were gradually released to the floating gate to write the desired data, but the present invention is not restricted to this. A case of gradually injecting electrons from the floating gate can also be adopted.

Also, in the embodiment shown in FIG. 4, the write voltage drive circuit 26 and the read voltage drive circuit 28 were commonly used by the multi-level memory cell 2 and the reference cells 16a, 16b, 16c, and 16d, but it is also possible to separately arrange the former for each of the latter.

Also, it is not always necessary to simultaneously drive the multi-level memory cell 2 and the reference cells 16a, 16b, 16c, and 16d by the same word line 18. It is also possible to constitute the system so as to drive them at almost the same time by using different word lines and different drive circuits.

Also, the arrangement of these drive circuits is not restricted to that of the embodiment shown in FIG. 4. It is also possible to arrange the same at a position between the reference cells 16a, 16b, 16c, and 16d and the multi-level memory cell 2 or other positions.

Figure 8:
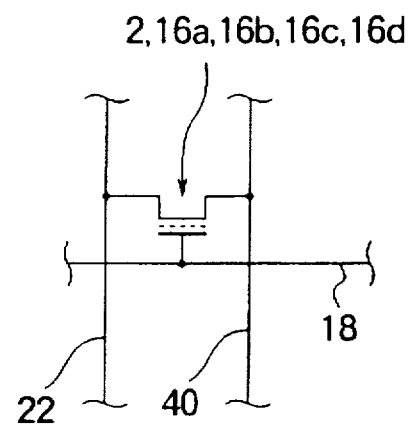
FIG. 8 is a view of the configuration of a circuit of the memory cell according to another embodiment of the present invention.
Figure 9:
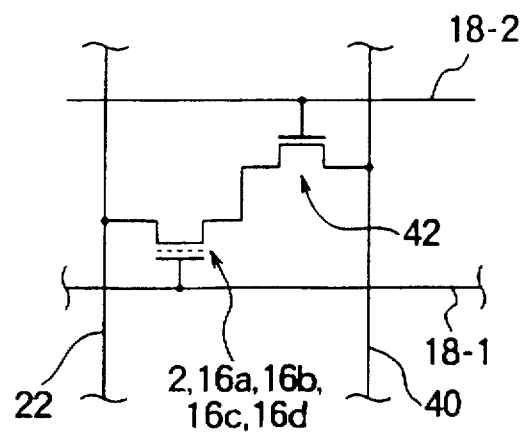
FIG. 9 is a view of the configuration of a circuit of the memory cell according to still another embodiment of the present invention.

Also, the circuit configuration of the multi-level memory cell 2 and the reference cells 16a, 16b, 16c, and 16d is not restricted to the example shown in FIG. 4. As shown in FIG. 8, a type wherein the source line 40 is divided for each of the columns or a type wherein the drains or sources of the cell transistors 2, 16a, 16b, 16c, and 16d are connected to the source line 40 via a selection transistor 42 as shown in FIG. 9 can also be adopted. Note that, preferably the circuit configurations of the multi-level memory cell 2 and the reference cells 16a, 16b, 16c, and 16d are the same.

Figure 10:
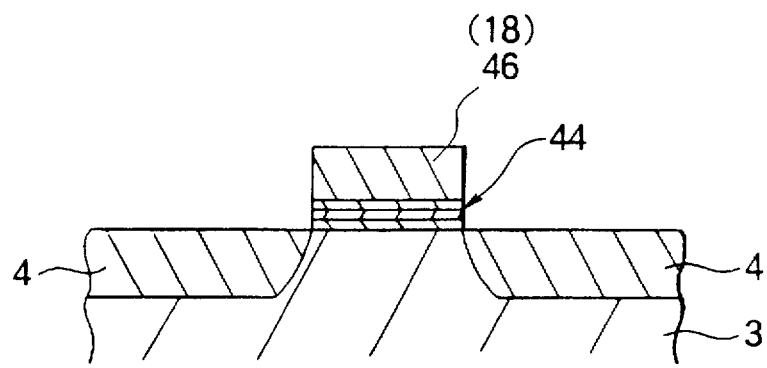
FIG. 10 is a cross-sectional view of an elementary part of a memory cell of another embodiment of the present invention.

Also, the cell transistors 2, 16a, 16b, 16c, and 16d are not particularly restricted in so far as they are constituted by transistors which can store or erase the charges. As shown in FIG. 10, a MONOS type cell transistor can also be adopted. in the example shown in FIG. 10, an ONO film 44 is laid on the surface of the semiconductor substrate 3, and a gate electrode 46 is laid on this. The source and drain region 4 is similar to that of the embodiment. The ONO film 44 is a film of a three-layer structure of $SiO_2/SiN/SiO_2$ which is formed by for example the following method.

First, the surface of the semiconductor substrate 3 is thermally oxidized to form an oxide film of about 2 nm, a silicon nitride film of about 9 nm is formed on the thermally oxidized film by a CVD process, etc., and the surface thereof is thermally oxidized to form an oxide film of about 4 or less. This process enables formation of an ONO film of a three-layer structure. This ONO film has a low leakage current and is excellent in controllability of thickness. Also, it can trap electrons in the silicon nitride film in the ONO film and at the boundary between the silicon nitride film and silicon oxide film and acts as a memory cell. As other films similarly having a memory function, an ON film ($SiO_2/SiN$) and N film (single SiN) are also known.

The gate electrode 46 is formed by for example a polycrystalline silicon film or polycide film etc. and acts as the word line 18.

Figure 11:
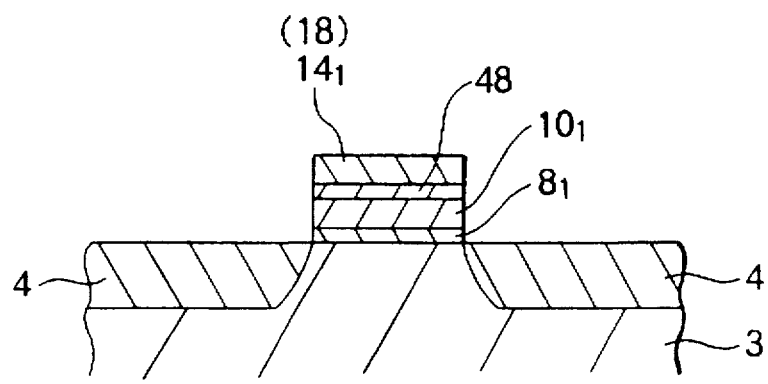
FIG. 11 is a cross-sectional view of an elementary part of a memory cell of still another embodiment of the present invention.

In the example shown in FIG. 11, on the surface of the semiconductor substrate 3, the floating gate $10_1$, a strong dielectric thin film 48 having a thickness of about 300 nm, and a control gate $14_1$, are stacked via a gate insulating film $8_1$, having a thickness of about 10 nm. In this example, the multi-level memory cell is constituted by utilizing the ferro-electric thin film 48.

Note that, as mentioned above, preferably the multi-level memory cell and reference cells have roughly the same construction in the thickness direction.

Next, an explanation will be made of a concrete circuit configuration around a sense amplifier including the reference current generation circuit 30 and the decision circuit 32 by referring to FIG. 6.

In the embodiment shown in FIG. 6, transistors $Q_2$, $Q_3$, $Q_{RA}$, and $Q_{DA}$ constitute a differential amplifier circuit having a forward feedback. The transistor $Q_1$ is a driving switch of that differential amplifier circuit. The transistor $Q_{R1}$ is a circuit which converts the selectively added current to a voltage and inputs the same to the grate of the transistor $Q_{RA}$. The transistor $Q_{D1}$ is a circuit which converts the signal current $i_{data}$ from the multi-level memory cell 2 to a voltage and inputs the same to the gate of the transistor $Q_{DA}$. Note that, as mentioned above, the signal current $i_{data}$ is $i_{data(0,0)}$ in a case where the data stored in the multi-level memory cell 2 is V (0, 0), $i_{data(0,1)}$ in the case of V (0, 1), and $i_{data(1,1)}$ in the case of V (1, 1).

In FIG. 6, the transistors $Q_1$, $Q_2$, and $Q_3$ are N-channel type transistors (or P-channel type transistors), and the transistors $Q_{RA}$, $Q_{DA}$, $Q_{R1}$ and $Q_{D1}$ are P-channel type transistors (or N-channel type transistors) having a reverse polarity to that of the transistors.

Further, in the circuit shown in FIG. 6, by adding the transistors $Q_4$, $Q_{RO}$ and $Q_{DO}$ with the connection relationship shown in FIG. 6, the voltage conversion is stabilized and, at the same time, the initial state of the differential amplifier circuit is set and a stable operation is achieved.

These transistors $Q_4$, $Q_{RO}$, and $Q_{DO}$ are P-channel type transistors (or N-channel type transistors). To the gates 49, 50 of the transistors $Q_{RO}$ and $Q_{DO}$ are input a strobe signal STB1 which is switched to a high level at the time of sensing. Also, a strobe signal STB2 which is switched to a high level at the time of sensing is input to the gate 51 of the transistor $Q_4$. Note, the strobe signal STB2 is set to high level after the strobe signal STB1 is switched to the high level.

Figure 12:
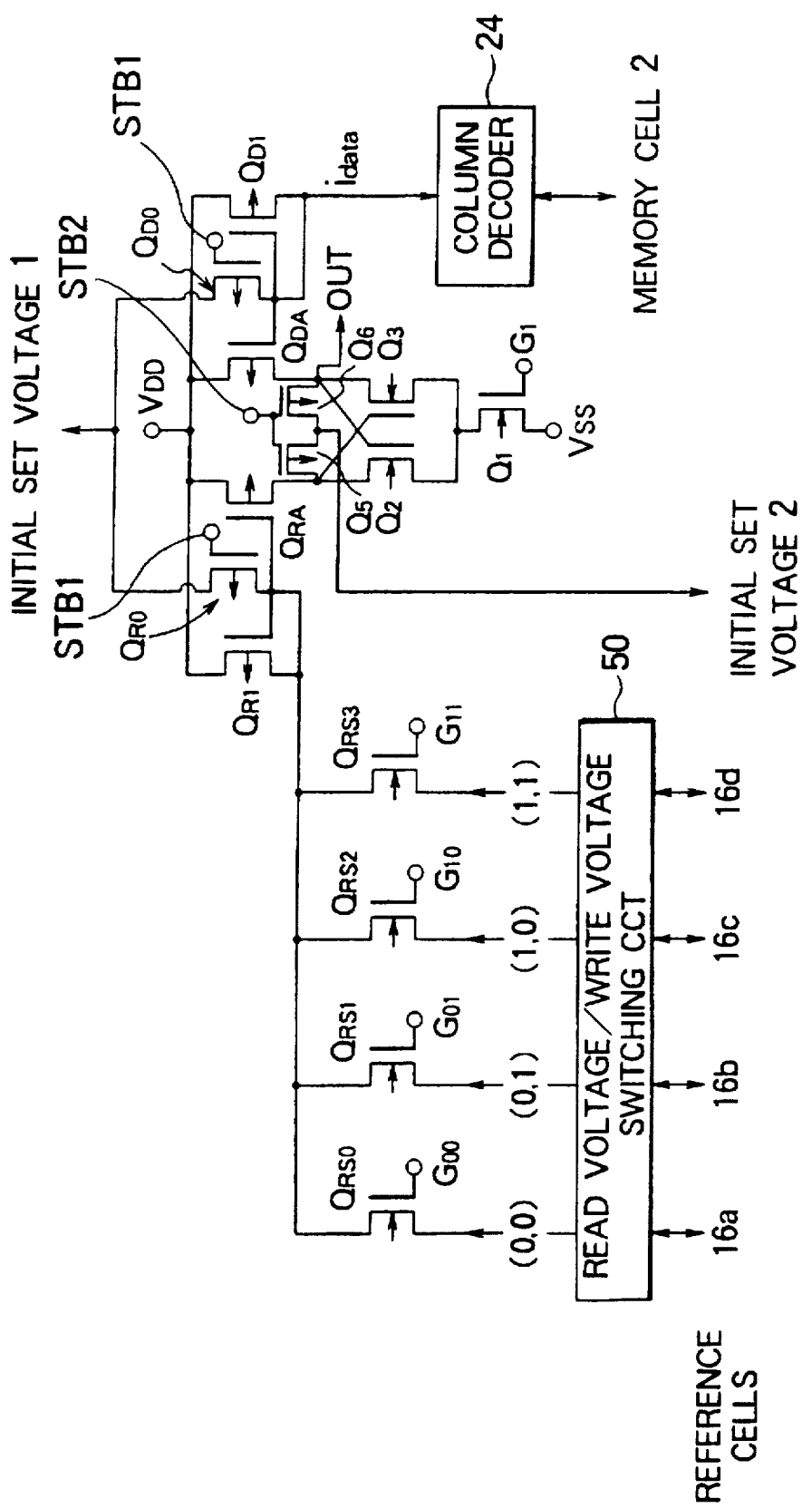
FIG. 12 is a circuit diagram showing another example of the configuration around the sense amplifier of the non-volatile semiconductor memory device according to a concrete embodiment of the present invention.

Moreover, also it is possible to adopt a configuration in which as the element for setting the initial state of the differential amplifier circuit and stably operating the same, in place of the single P-channel type transistor (or N-channel type transistor) $Q_4$, as shown in FIG. 12, two P-channel type transistors (or N-channel type transistors) $Q_5$ and $Q_6$ are provided, the gates of the two transistors $Q_5$ and $Q_6$ are connected to the supply line of the strobe signal STB2 similar to the case of the circuit of FIG. 6 mentioned above, and the connection points of the two transistors $Q_5$ and $Q_6$ are connected to the initial set voltage (potential) 2.

Also, the reference current generation circuit 30 is constituted by, as shown in FIG. 6, N-channel type transistors $Q_{RS0}$, $Q_{RS1}$, $Q_{RS2}$, and $Q_{RS3}$ which are respectively provided in the bit line 22 to which the respective reference cells 16a, 16b, 16c, and 16d are connected and are turned on or off by the control of the gate voltage; a wired-OR interconnection connecting the output interconnections of these transistors; and a pair of transistors $Q_{R1}$ and $Q_{RA}$ of a size (W/L) ratio which is adjusted so as to halve the added current output of this wired-OR interconnection.

Namely, the transistors $Q_{R1}$ and $Q_{RA}$, are commonly used by the reference current generation circuit 30 and the decision circuit 32. In that sense, the two circuits are integrally constituted.

Figure 13:
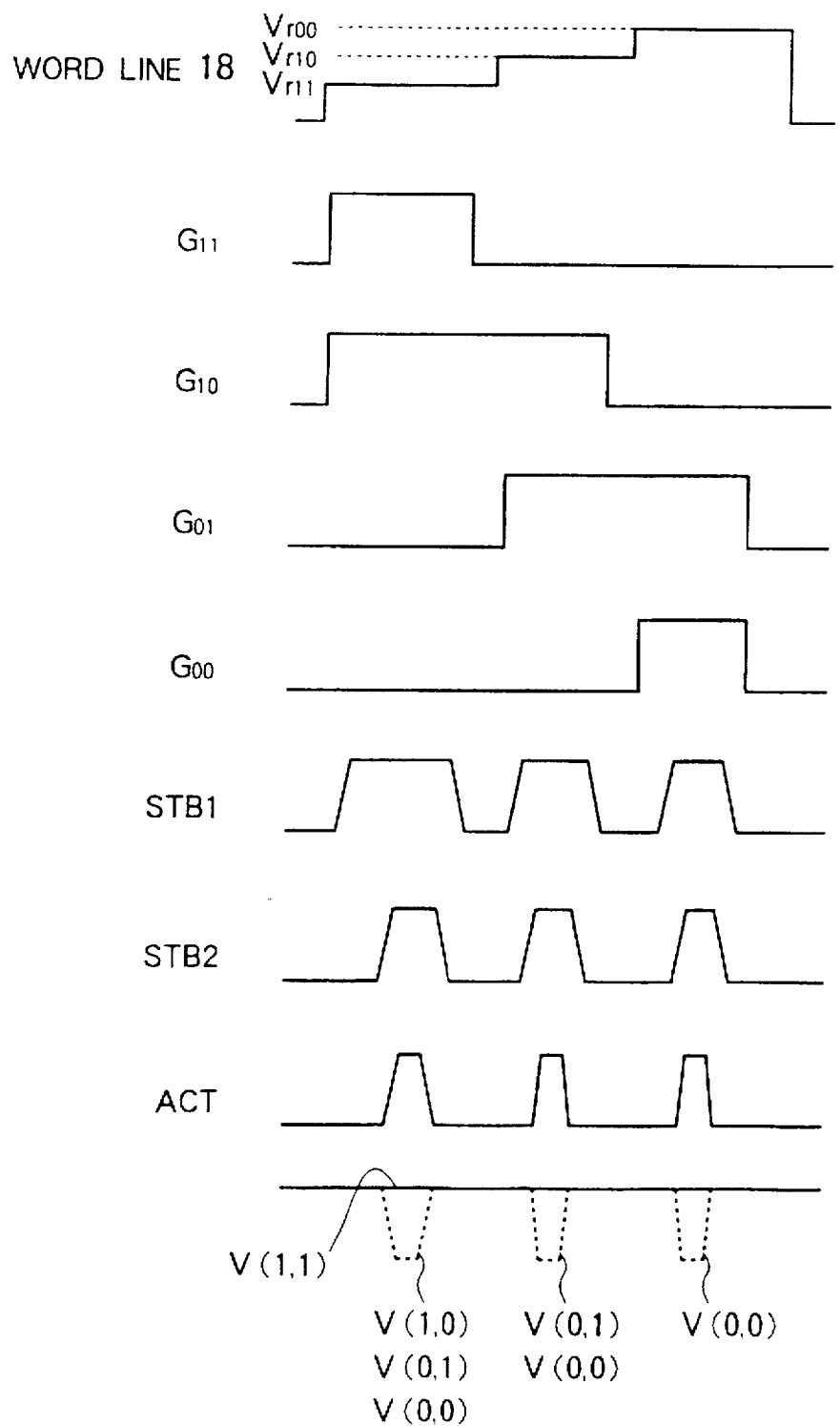
FIG. 13 is a timing chart of signals to be supplied to respective portions of the circuit of FIG. 6.

FIG. 13 is a timing chart of voltage applied to the word line 18 at the time of the reading, the control signals to the gates $G_{00}$, $G_{01}$, $G_{10}$, and $G_{11}$ of the transistors $Q_{RS0}$, $Q_{RS1}$, $Q_{RS2}$, and $Q_{RS3}$ of the reference current generation circuit 30, the strobe signals STB1 and STB2 to the comparison and decision circuit 32, and an activation signal ACT to the gate $G_1$ of the transistor $Q_1$.

In this embodiment, when set to the read mode, the address-designated word line 18 and bit line 22 are held at a predetermined voltage, and a data current $i_{data}$ corresponding to the stored data flows from the selected multi-level memory cell 2, specifically $i_{data(0,0)}$ flows in a case where the data stored in the multi-level memory cell 2 is V (0, 0), $i_{data(0,1)}$ flows in a case of V (0, 1), $i_{data(1,0)}$ flows in a case of V (1, 0), and $i_{data(1,1)}$ flows in a case of V (1, 1). These flow into the transistor $Q_{D1}$ of the decision circuit 32. Also, reference data currents $i_{r00}$, $i_{r01}$, $i_{r10}$, and $i_{r11}$ flow from the reference cells 16a, 16b, 16c, and 16d connected to the word line 18 the same as that of the selected multi-level memory cell 2 to the bit line 22. These currents are input to the reference current generation circuit 30 through the read voltage/write voltage switching circuit 50.

In the reference current generation circuit 30, two among the input four currents are selectively added, this added current flows into the transistor $Q_{R1}$ of the decision circuit 32, the selectively added current is converted to a voltage, and this voltage is input to the gate of the transistor $Q_{RA}$.

Where the reference current $i_{re}$ is set to ½ of the added current, the relationship of the transistors $Q_{RA}$, $Q_{DA}$, $Q_{R1}$, and $Q_{D1}$ is set to the relationship as shown by the case II in the following Table 1.

In the case of comparing double the reference current and double the data current, the channel dimensions of the transistors $Q_2$, $Q_3$, $Q_{RA}$, $Q_{DA}$, $Q_{R1}$, and $Q_{D1}$ are set to the relationships as shown by the case I in Table 1 and Table 2. In this case, k=2.

TABLE 1

Case where $Q_2$ and $Q_3$ have same dimensional ratio (W/L ratio)

| | Case I | Case II |
|---|---|---|
| Channel width W of $Q_{RA}$/channel length L (ratio) | Same as $Q_{R1}$ | ½ of $Q_{R1}$ |
| W/L (ratio) of $Q_{DA}$ | Twice of $Q_{D1}$ | Same as $Q_{D1}$ |

TABLE 2

Case where $Q_{R1}$ and $Q_{RA}$ and where $Q_{D1}$ and $Q_{DA}$ have the same dimensional ratios (W/L ratio)

| | Case I |
|---|---|
| W/L ratio of $Q_2$ | Twice of $Q_3$ |

Note that, the transistor $Q_2$ and the transistor $Q_3$ had the same dimensions, but as shown in Table 2, even in a case where the transistors $Q_{R1}$ and $Q_{RA}$ and the transistors $Q_{D1}$ and $Q_{DA}$ have the same dimensional ratios (W/L ratio), it is also possible to constitute a substantial ½ circuit by setting W/L ratio of the transistor $Q_2$ to two times that the transistor $Q_3$. Also at this time, the ½ circuit has been integrally formed with the differential amplifier. Note that, integral formation is defined in the present invention as that each having a common transistor.

In the decision circuit 32, in the read mode, a ramp voltage input ACT which changes from $V_{SS}$ (low level) to $V_{DD}$ (high level) is applied to the gate $G_1$ of the transistor $Q_1$ for activation. By comparing the magnitude between the read currents $i_{data(0,0)}$, $i_{data(0,1)}$, $i_{data(1,0)}$, and $i_{data(1,0)}$ of the selected multi-level memory cell 2 and the reference current $i_{re}$ it is decided which of the data V (0, 0), V (0, 1), V (1, 0), and V (1, 1) is stored in the multi-level memory cell 2.

Note that, the selection of the read currents from the reference cells 16a, 16b, 16c, and 16d which to be added in a concrete reference current generation circuit 30 and the decision operation in the decision circuit 32 are carried out as shown in for example FIG. 13. Namely, a voltage $V_{r11}$ is given to the word line 18, a high level signal is supplied to the gate $G_{11}$ of the transistor $Q_{RS3}$ and the gate $G_{10}$ of $Q_{RS2}$, and reference data cell currents $i_{r11}$ and $i_{r10}$ from the reference cells 16d and 16c are combined and added. At this time, the signals supplied to the gate $G_{01}$ of the transistor $Q_{RS1}$ and the gate $G_{00}$ of $Q_{RS0}$ are held at a low level. This combined current is input to the decision circuit 32 and halved, and it is decided whether the data stored in the multi-level memory cell 2 is V (1, 1), V (1, 0), V (0, 1), or V (0, 0).

Next, the signal to the gate $G_{11}$ of the transistor $Q_{RS3}$ of the reference current generation circuit 30 is switched to the low level, a voltage $V_{r10}$ is given to the word line 18, the signal to the gate $G_{01}$ of the transistor $Q_{RS1}$ is switched to the high level while holding the signal to the gate $G_{10}$ of the transistor $Q_{RS2}$ at a high level, and reference data cell currents $i_{r10}$ and $i_{r01}$ from the reference cells 16c and 16b are combined and added. This combined current is input to the decision circuit 32 and halved, and it is decided whether the data stored in the multi-level memory cell 2 is V (1, 0), or V (0, 1), or V (0, 0).

Next, the signal to the gate $G_{10}$ of the transistor $Q_{RS2}$ of the reference current generation circuit 30 is switched to the low level, a voltage $V_{r00}$ is given to the word line 18, the signal to the gate $G_{00}$ of the transistor $Q_{RS0}$ is switched to the high level while holding the signal to the gate $G_{01}$ of the transistor $Q_{RS1}$ at a high level, and reference data cell currents $i_{r01}$ and $i_{r00}$ from the reference cells 16b and 16a are combined and added. This combined current is input to the decision circuit 32 and halved, and it is decided whether the data stored in the multi-level memory cell 2 is V (0, 1) or V (0, 0).

In this way, in the present embodiment, three selective additions and comparison/decision operations by the differential amplifier are carried out in the reference current generation circuit 30 and the decision circuit 32 so as to determine the data stored in the multi-level memory cell 2.

Note that the switching control for the transistors $Q_{RS0}$ to $Q_{RS3}$ of the reference current generation circuit 30 is not restricted to that of the example shown in FIG. 13. Converse to the case of FIG. 13, it is also possible to control the system so as to sequentially exhibit a conductive state from the transistors $Q_{RS0}$ and $Q_{RS1}$.

Also, for example, the currents $Q_{RS1}$ and $Q_{RS2}$ may be first brought into a conductive state and a decision made as to whether the data stored in the multi-level memory cell 2 is V (1, 1) or V (1, 0) or is V (0, 1) or V (0, 1) by the comparison and decision circuit 32, and then control performed so that the transistors $Q_{RS3}$ and $Q_{RS2}$ or the transistors $Q_{RS1}$ and $Q_{RS0}$ become conductive in state based on the result of decision, whereby it can be decided whether the data stored in the multi-level memory cell 2 is V (1, 1) or V (1, 0) or is V (0, 1) or V (0, 1). In this case, by performing the two selective additions and comparison/decision operations in the differential amplifier in the reference current generation circuit 30 and the decision circuit 32, it is possible to determine the data stored in the multi-level memory cell 2.

Figure 14:
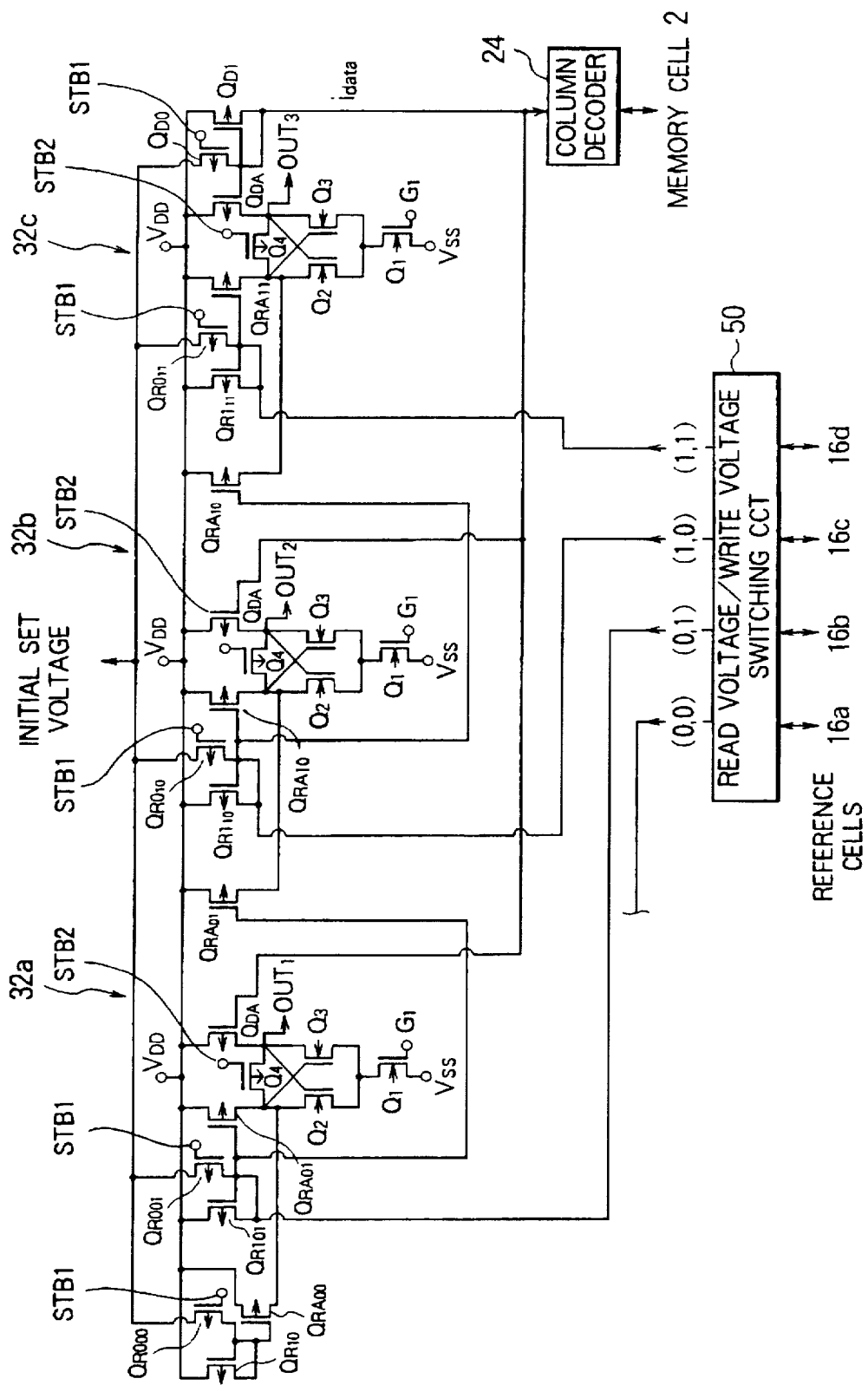
FIG. 14 is a circuit diagram showing an example of the configuration in which three decision circuits comparing the reference currents of any two reference cells and the data of the non-volatile semiconductor memory device according to another embodiment of the present invention.

Further, as shown in FIG. 14, if three decision circuits 32a, 32b, and 32c comparing the intermediate value, or k-multiple of the same, of currents of any two reference cells and data, or k-multiple of the same, are provided, the decisions of the data stored in the multi-level memory cell 2 can be simultaneously carried out. At this time, a voltage $V_{r00}$ is applied to the word line 18. In this circuit, the output $OUT_1$ of the decision circuit 32a becomes a high level ($V_{DD}$ level) when the data is (1, 1), (1, 0) and (0, 1), the output $OUT_2$ of the decision circuit 32b becomes a high level when the data is (1, 1) and (1, 0), and the output $OUT_3$ of the decision circuit 32c becomes a high level when the data is (1, 1). These outputs $OUT_1$ to $OUT_3$ are input to the logical circuit as shown in for example FIG. 15, computation is carried out there, and the multi-level information stored in the memory cell 2 is output.

Figure 15:
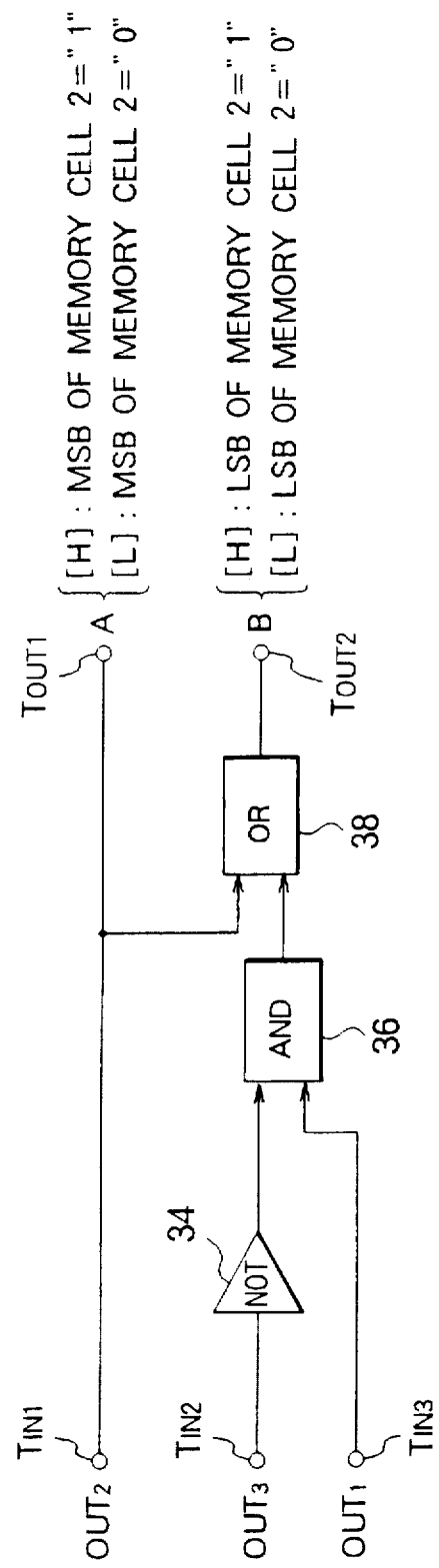
FIG. 15 is a view of an example of the configuration of a logical circuit for performing computations on the multi-level information according to the present invention.

The logical circuit shown in FIG. 15 is a 3-input 2-output logical circuit. The output signal $OUT_2$ of the decision circuit 32b of FIG. 14 is input to an input end $T_{IN1}$; the output signal $OUT_3$ of the decision circuit 32c of FIG. 14 is input to an input end $T_{IN2}$; and the output signal $OUT_1$ of the decision circuit 32a of FIG. 14 is input to an input end $T_{IN3}$. The signal $OUT_2$ input to the input end $T_{IN1}$ is output as a direct signal A from one output end $T_{OUT1}$ between the two and, at the same time, input to one input end of the 2-input OR circuit 38. The signal $OUT_3$ input to the input end $T_{IN2}$ receives an inversion action at a negative (inversion: NOT)) circuit 34 and is input to one input end of the 2-input AND circuit 36. Also, the signal $OUT_1$ input to the input end $T_{IN3}$ is input to the other input end of the AND circuit 36. The result of the conjunction of the AND circuit 36 is input to the other input end of the OR circuit 38, and the result of the disfunction is output as a signal B from the output end $T_{OUT2}$.

In this logical circuit, the MSB of the memory cell 2 indicates a logic "1" in a case where the output signal A is at a high level "H" the MSB of the memory cell 2 indicates a logic "0" in the case of a low level "L"; the LSB of the memory cell 2 indicates a logic "1" in the case where the output signal B is at a high level "L"; and the LSB of the memory cell 2 indicates a logic "0" in the case of a low level "L".

Figure 16:
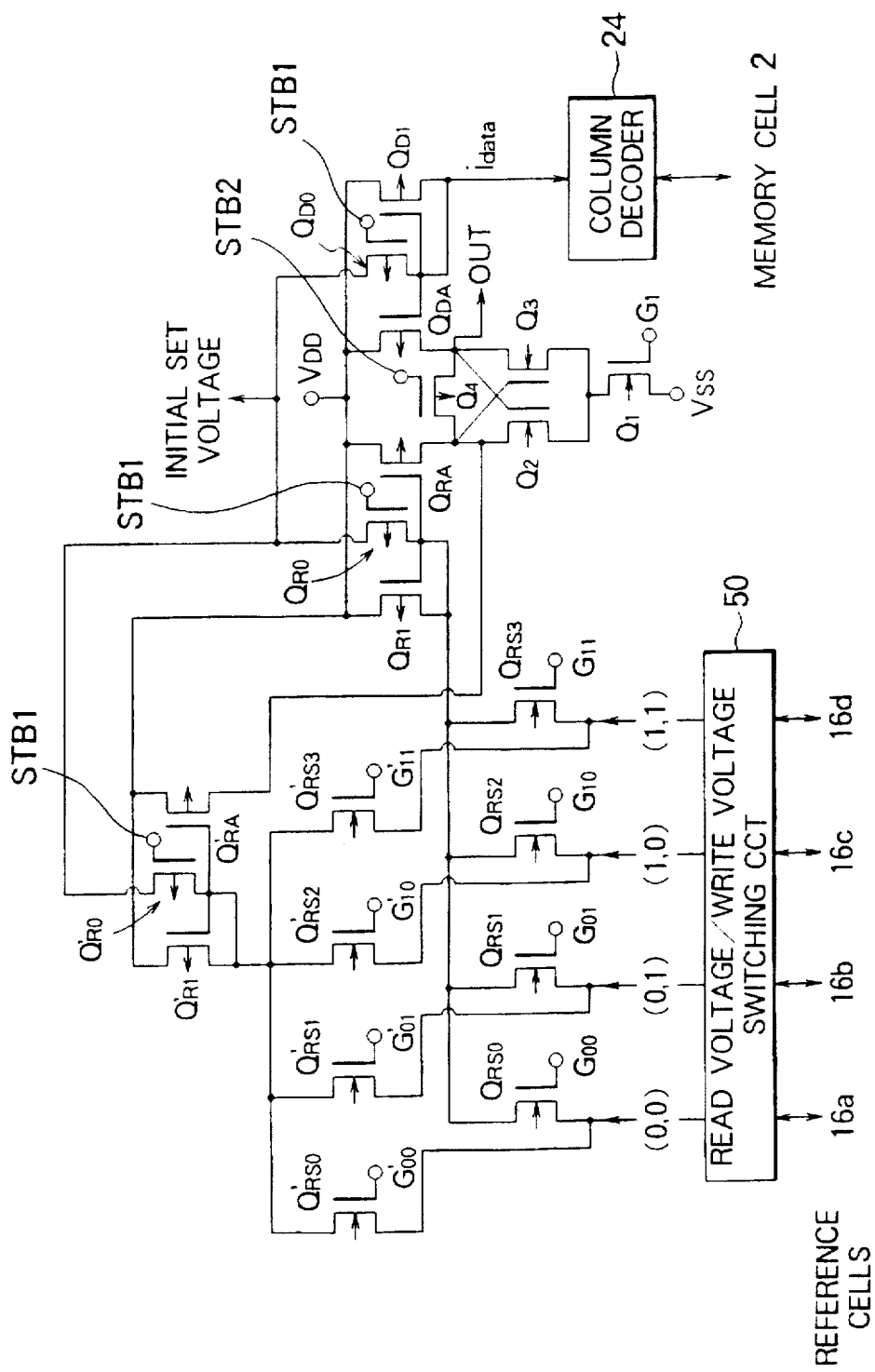
FIG. 16 is a circuit diagram showing an example of the configuration around the sense amplifier having a weighted addition circuit of the non-volatile semiconductor memory device according to still another embodiment of the present invention.

In the circuit shown in FIG. 6 mentioned above, simple addition is carried out by the wired-OR interconnection, but in general, to perform weighted addition, it is constituted as the circuit as shown in FIG. 16. In this case, it is constituted by a wired-OR interconnection to which two first and second MOS transistors turned on or off by the control of the gate voltage to each of four outputs of the read voltage/write voltage switching circuit 50 are connected in parallel and connects output interconnections of four first MOS transistors $Q_{RS0}$, $Q_{RS1}$, $Q_{RS2}$, and $Q_{RS3}$; a plurality of MOS transistors $Q_{R1}$ and $Q_{RA}$ adjusted in size (W/L) so as to multiply the current output of this wired-OR interconnection by n/k; and a wired-OR interconnection connecting output interconnections of four second MOS transistors $Q'_{RS0}$, $Q'_{RS1}$, $Q'_{RS2}$, and $Q_{RS3}$; and a plurality of MOS transistors $Q'_{R1}$ and $Q'_{RA}$ adjusted in size (W/L) so as to multiply the current output of this wired-OR interconnection by m/k.

In such a configuration, by setting the dimensional ratios of the transistors $Q_{R1}'$, $Q_{RA}'$, $Q_{R1}$, and $Q_{RA}$ to the desired values and turning on one transistor among the $Q_{RS0}$ to $Q_{RS3}$ and the $Q_{R0}'$ to $Q_{RS3}$, so-called weighted addition of the current of two reference cells can be realized.

Note that, in all of the above-mentioned embodiments except the embodiment shown in FIG. 16, the explanation was made by setting the intermediate value to ½ of the sum of two current values, but the invention is not restricted to this. If is enough that the intermediate value be a value between two current values.

Also, in the above-mentioned embodiments, the explanation was made of a NOR-type memory, but the present invention is not restricted to this and can be applied also with respect to a NAND type, AND type, DINOR type, etc. Also, in the above-mentioned embodiments, the explanation was made by defining the multi-level as four levels, but needless to say the invention can also be applied to three levels, five levels, . . . , eight levels, etc.

As explained above, according to the present invention, particularly in a non-volatile semiconductor memory device having small windows, the decision of the data stored in the multi-level memory cell can be accurately carried out without regard as to deterioration of the rewriting characteristic or deterioration of data retention characteristic. Also, even if there are manufacturing variations in the multi-level memory cell, it can be considered that similar manufacturing variations exist also in the reference cells. Further, reference data (intermediate value current) acting as the reference for the comparison and decision circuit is positioned between the windows. Therefore, as a result, the accuracy of reading of data will not be degraded. Accordingly, also the manufacturing yield of the non-volatile semiconductor memory device is substantially improved.

What is claimed is:

1. A non-volatile semiconductor memory device comprising:

a plurality of non-volatile memory cells;

a plurality of reference cells corresponding to a number of states of each of said non-volatile memory cells;

a reference current generation circuit which generates a current, or k-multiple current of the same, of current outputs from at least two cells among the-plurality of said reference cells at a time of reading data from said non-volatile memory cells; and a decision circuit which decides a value stored in said non-volatile memory cell by comparing a current, or k-multiple current of the same, of said non-volatile memory and said output current of said reference current generation circuit, wherein the writing of the data to said plurality of reference cells is carried out at almost the same time as the writing of data into a predetermined number of non-volatile memory cells.

2. A non-volatile semiconductor memory device as set forth in claim 1, wherein each of said plurality of non-volatile memory cells comprises a multi-level type memory cell for storing ternary state values.

3. A non-volatile semiconductor memory device as set forth in claim 2, wherein each of said non-volatile memory cells is constituted by a non-volatile semiconductor memory element with which enables an increase/decrease of the amount of storage of the charges or an inversion of polarity is possible, and wherein each of said reference cells constitutes said the multi-level storage memory cell.

4. A non-volatile semiconductor memory device as set forth in claim 3, wherein said non-volatile memory cell and said reference cell are either of a transistor having a floating gate which can store charges, a transistor having a charge trapping function, and a transistor having a ferro-electric film.

5. A non-volatile semiconductor memory device as set forth in claim 1, wherein said plurality of reference cells are provided for every predetermined number of non-volatile memory cells.

6. A non-volatile semiconductor memory device as set forth in claim 1, wherein said plurality of reference cells and said predetermined number of non-volatile memory cells are connected to the same word lines.

7. A non-volatile semiconductor memory device comprising:

a plurality of non-volatile memory cells;

a plurality of reference cells corresponding to a number of states of each of said non-volatile memory cells;

a reference current generation circuit which generates a current, or k-multiple current of the same, of current outputs from at least two cells among the plurality of said reference cells at a time of reading data from said non-volatile memory cells; and a decision circuit which decides a value stored in said non-volatile memory cell by comparing a current, or k-multiple current of the same, of said non-volatile memory and said output current of said reference current generation circuit, wherein said reference current generation circuit and said decision circuit are integrally formed and a transistor constituting a part of said reference current generation circuit acts also as the transistor of a part of a differential amplifier constituting said decision circuit.

8. A non-volatile semiconductor memory device comprising:

a plurality of non-volatile memory cells;

a plurality of reference cells corresponding to a number of states of each of said non-volatile memory cells;

a reference current generation circuit which generates a current, or k-multiple current of the same, of current outputs from at least two cells among the plurality of said reference cells at a time of reading data from said non-volatile memory cells;

a decision circuit which decides a value stored in said non-volatile memory cell by comparing a current, or k-multiple current of the same, of said non-volatile memory and said output current of said reference current generation circuit, wherein said reference current generation circuit comprises an adder circuit which selects at least two among the output lines of said plurality of reference cells and adds the current values flowing through the output lines and a transistor which receives the current of the added value of said adder circuit and which has, as a predetermined ratio, a relationship of the values of the channel width divided by the channel length so as to generate a current or k-multiple current of the same, of a plurality of current values which are added.

9. A non-volatile semiconductor memory device as set forth in claim 8, wherein said adder circuit performs simple addition on the at least two current values which are selected.

10. A non-volatile semiconductor memory device as set forth in claim 8, wherein said adder circuit performs weighted addition on the at least two current values which are selected.

11. A non-volatile semiconductor memory device as set forth in claim 8, comprising:

a first current-to-voltage conversion transistor which converts an output current of said adder circuit to a voltage;

a first transistor for a differential amplifier to which the output line of said first current-to-voltage conversion transistor is connected, which constitutes the transistor of a part of a differential amplifier;

a second current-to-voltage conversion transistor which converts a signal current of the output line of said non-volatile memory cell to a voltage; and a second transistor for the differential amplifier to which the output line of said second current-to-voltage conversion transistor is connected, which constitutes the transistor of a part of the differential amplifier, wherein, these first current-to-voltage conversion transistor, second current-to-voltage conversion transistor, first transistor for differential amplifier, and second transistor for differential amplifier, have as predetermined ratios, relationships of values of the channel widths divided by the channel lengths.

12. A non-volatile semiconductor memory device as set forth in claim 11, further comprising a transistor for stabilizing a voltage conversion operation of said first current-to-voltage conversion transistor and second current-to-voltage conversion transistor and, for setting an initial state of the differential amplifier is added.

\* \* \* \* \*